(12) United States Patent
Manassen et al.

(10) Patent No.: US 11,346,657 B2
(45) Date of Patent: May 31, 2022

(54) MEASUREMENT MODES FOR OVERLAY

(71) Applicant: KLA Corporation, Milpitas, CA (US)

(72) Inventors: Amnon Manassen, Haifa (IL); Andrew V. Hill, Berkeley, CA (US); Gilad Laredo, Haifa (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/068,328

(22) Filed: Oct. 12, 2020

(65) Prior Publication Data

US 2021/0364279 A1   Nov. 25, 2021

Related U.S. Application Data

(60) Provisional application No. 63/028,568, filed on May 22, 2020.

(51) Int. Cl.
  *G01B 11/27*   (2006.01)
(52) U.S. Cl.
  CPC ........ *G01B 11/272* (2013.01); *G01B 2210/56* (2013.01)
(58) Field of Classification Search
  CPC .................................................. G01B 11/272
  USPC ....................................................... 356/138
  See application file for complete search history.

(56) References Cited

U.S. PATENT DOCUMENTS

| 8,786,825 | B2 | 7/2014 | Kerkhof et al. |
| 2004/0245439 | A1 | 12/2004 | Shaver |
| 2006/0050261 | A1* | 3/2006 | Brotsack ............. G03F 7/70108 355/71 |
| 2012/0004439 | A1 | 1/2012 | Choi et al. |
| 2017/0351184 | A1 | 12/2017 | Peng et al. |
| 2019/0041329 | A1 | 2/2019 | Hill et al. |
| 2019/0310080 | A1* | 10/2019 | Hill ..................... G03F 7/70633 |
| 2020/0124408 | A1 | 4/2020 | Hill et al. |
| 2021/0096061 | A1* | 4/2021 | Hill ........................ G06T 7/0004 |
| 2021/0364279 | A1* | 11/2021 | Manassen et al. ... G01B 11/272 |

OTHER PUBLICATIONS

PCT International Search Report and Written Opinion for International Application No. PCT/US2021/032655 dated Sep. 7, 2021, 10 pages.

* cited by examiner

*Primary Examiner* — Tarifur R Chowdhury
*Assistant Examiner* — Omar H Nixon
(74) *Attorney, Agent, or Firm* — Suiter Swantz pc llo

(57) ABSTRACT

An overlay metrology tool may include an illumination source, illumination optics to illuminate an overlay target having periodic features with one or more illumination beams, collection optics to direct diffracted light from the periodic features of the overlay target to a detector, an adjustable pupil mask located at a pupil plane, and a controller. The adjustable pupil mask may include one or more individually-addressable control zones distributed across the one or more portions of the pupil plane to provide an adjustable pupil transmissivity distribution. The controller may direct the adjustable pupil mask to provide a selected pupil transmissivity distribution corresponding to a selected overlay metrology recipe, where the selected pupil transmissivity distribution corresponds to a selected configuration of the one or more control zones providing transmission of a selected set of diffraction orders from the target to the detector.

35 Claims, 12 Drawing Sheets

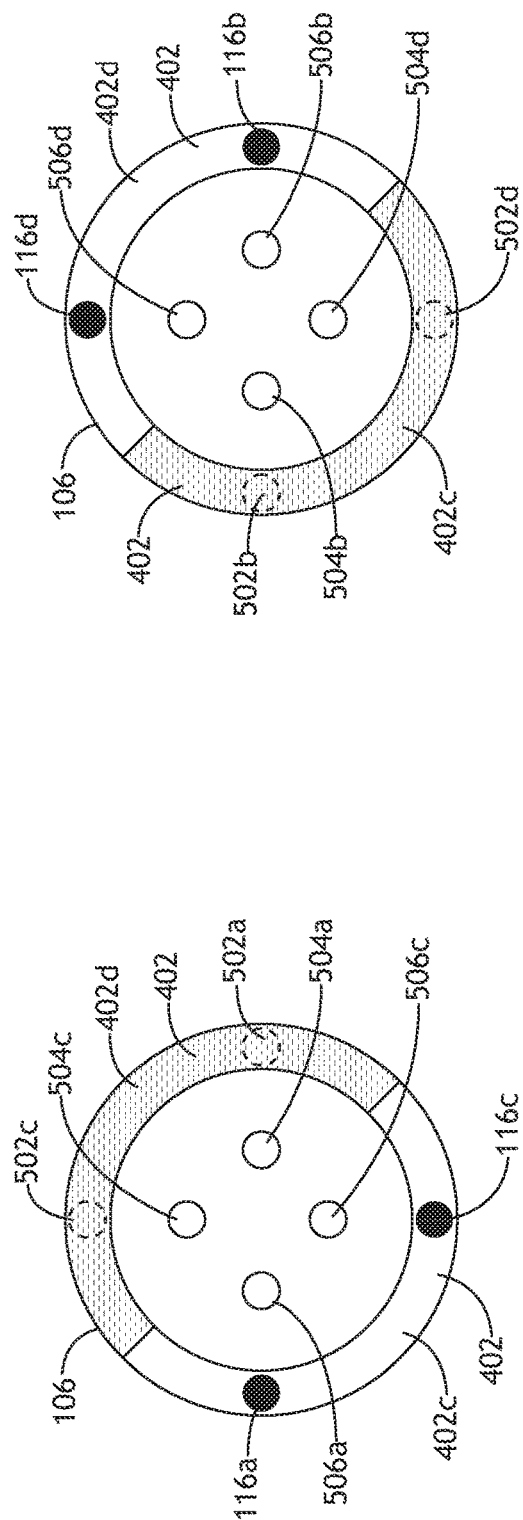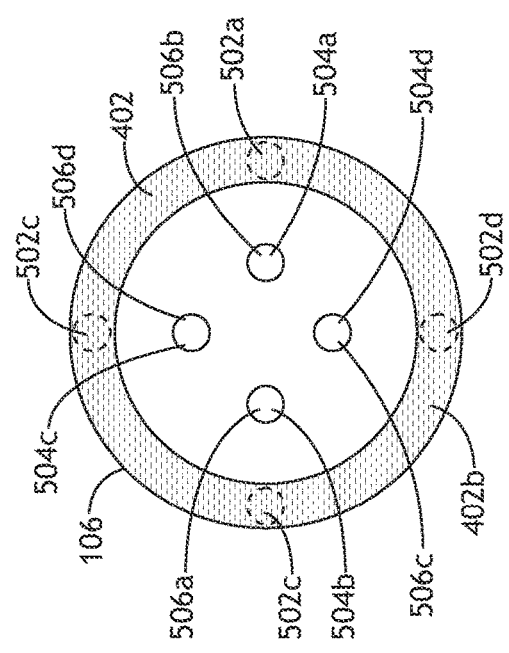
FIG. 5A
FIG. 5B
FIG. 5C

MEASUREMENT MODES FOR OVERLAY

CROSS-REFERENCE TO RELATED APPLICATION

The present application claims the benefit under 35 U.S.C. § 119(e) of U.S. Provisional Application Ser. No. 63/028,568, filed May 22, 2020, entitled MEASUREMENT MODES FOR OVERLAY, naming Amnon Manassen, Andy Hill, and Gilad Laredo as inventors, which is incorporated herein by reference in the entirety.

TECHNICAL FIELD

The present disclosure relates generally to overlay metrology and, more particularly, to systems and methods for toggling between multiple overlay measurement techniques with an adjustable pupil mask.

BACKGROUND

Overlay metrology systems typically characterize the overlay alignment of multiple layers of a sample by measuring the relative positions of overlay target features located on layers of interest. As the size of fabricated features decreases and the feature density increases, the demands on overlay metrology systems needed to characterize these features increase. Different overlay metrology techniques may provide different tradeoffs between accuracy, repeatability, or throughput. Accordingly, it may be advantageous to utilize different overlay metrology techniques on various portions of a sample or between different samples in a lot. However, different overlay metrology techniques may require different specifications for illumination of and collection of light from the sample during a measurement. It may therefore be desirable to provide systems and methods for measuring overlay using different overlay techniques with a single overlay metrology tool and further to provide efficient switching between the different overlay techniques.

SUMMARY

An overlay metrology tool is disclosed in accordance with one or more illustrative embodiments of the present disclosure. In one illustrative embodiment, the overlay metrology tool includes an illumination source. In another illustrative embodiment, the overlay metrology tool includes one or more illumination optics to illuminate an overlay target with one or more illumination beams from the illumination source, where the overlay target includes periodic features along one or more measurement directions. In another illustrative embodiment, the overlay metrology tool includes one or more collection optics to direct diffracted light from the periodic features of the overlay target to a detector. In another illustrative embodiment, the overlay metrology tool includes an adjustable pupil mask located at a pupil plane, where the pupil plane corresponds to a collection pupil plane. In another illustrative embodiment, the adjustable pupil mask includes one or more control zones distributed across the one or more portions of the pupil plane, where the one or more control zones are individually addressable to provide an adjustable pupil transmissivity distribution, and where the adjustable pupil transmissivity distribution provides selective control of the passage of diffracted light in the respective one or more portions of the pupil plane to the detector. In another illustrative embodiment, the overlay metrology tool includes a controller communicatively coupled to the adjustable pupil mask. In another illustrative embodiment, the controller may direct the adjustable pupil mask to provide a selected pupil transmissivity distribution corresponding to a selected overlay metrology recipe, where the selected pupil transmissivity distribution corresponds to a selected configuration of the one or more control zones providing transmission of a selected set of diffraction orders from the target to the detector. In another illustrative embodiment, the controller may determine overlay measurements along the one or more measurement directions based on measurement data from the detector.

An overlay metrology tool is disclosed in accordance with one or more illustrative embodiments of the present disclosure. In one illustrative embodiment, the overlay metrology tool includes an illumination source. In another illustrative embodiment, the overlay metrology tool includes one or more illumination optics to illuminate an overlay target with one or more illumination beams from the illumination source, where the overlay target includes periodic features along one or more measurement directions. In another illustrative embodiment, the overlay metrology tool includes one or more collection optics to direct diffracted light from the overlay target to a detector. In another illustrative embodiment, the overlay metrology tool includes an adjustable pupil mask located at a pupil plane, where the pupil plane corresponds to a collection pupil plane. In another illustrative embodiment, the adjustable pupil mask includes one or more control zones distributed across the one or more portions of the pupil plane, where the one or more control zones are individually addressable to provide an adjustable pupil transmissivity distribution, and where the adjustable pupil transmissivity distribution provides selective control of the passage of diffracted light in the respective one or more portions of the pupil plane to the detector. In another illustrative embodiment, the overlay metrology tool includes a controller communicatively coupled to the adjustable pupil mask. In another illustrative embodiment, the controller may receive overlay metrology recipes for a plurality of overlay targets on the sample. In another illustrative embodiment, the controller may receive overlay metrology recipes for a plurality of overlay targets on the sample. In another illustrative embodiment, the controller may direct the adjustable pupil mask to adjust the pupil transmissivity distribution according to the respective overlay metrology recipes for measurements of the plurality of overlay targets on the sample. In another illustrative embodiment, the controller may determine overlay measurements along the one or more measurement directions for the plurality of overlay targets on the sample based on measurement data from the detector.

A method is disclosed in accordance with one or more illustrative embodiments of the present disclosure. In one illustrative embodiment, the method includes receiving overlay metrology recipes for one or more overlay targets on a sample. In another illustrative embodiment, the method includes directing an adjustable pupil mask to adjust a pupil transmissivity distribution according to the respective overlay metrology recipes for measurements of the one or more overlay targets on the sample with an overlay metrology tool. In another illustrative embodiment, the overlay metrology tool includes one or more illumination optics to illuminate an overlay target with one or more illumination beams from the illumination source, where the overlay target includes periodic features along one or more measurement directions. In another illustrative embodiment, the overlay metrology tool includes one or more collection optics to direct diffracted light from the overlay target to a detector. In another illustrative embodiment, the overlay metrology tool includes the adjustable pupil mask located at a pupil plane, where the pupil plane corresponds to a collection pupil plane. In another illustrative embodiment, the adjustable pupil mask includes one or more control zones distributed across the one or more portions of the pupil plane, where the one or more control zones are individually addressable to provide an adjustable pupil transmissivity distribution, and where the adjustable pupil transmissivity distribution provides selective control of the passage of diffracted light in the respective one or more portions of the pupil plane to the detector. In another illustrative embodiment, the method includes determining overlay measurements along the one or more measurement directions for the one or more overlay targets on the sample based on measurement data from the detector.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 5A is a schematic view of the adjustable pupil mask in FIG. 4C configured with a first recipe to provide a first measurement, in accordance with one or more embodiments of the present disclosure.

FIG. 5B is a schematic view of the adjustable pupil mask in FIG. 4C configured with a second recipe to provide a second measurement, in accordance with one or more embodiments of the present disclosure.

FIG. 5C is a schematic view of the adjustable pupil mask configured as in FIG. 4B for simultaneous overlay metrology in accordance with one or more embodiments of the present disclosure.

DETAILED DESCRIPTION

Figure 1A:
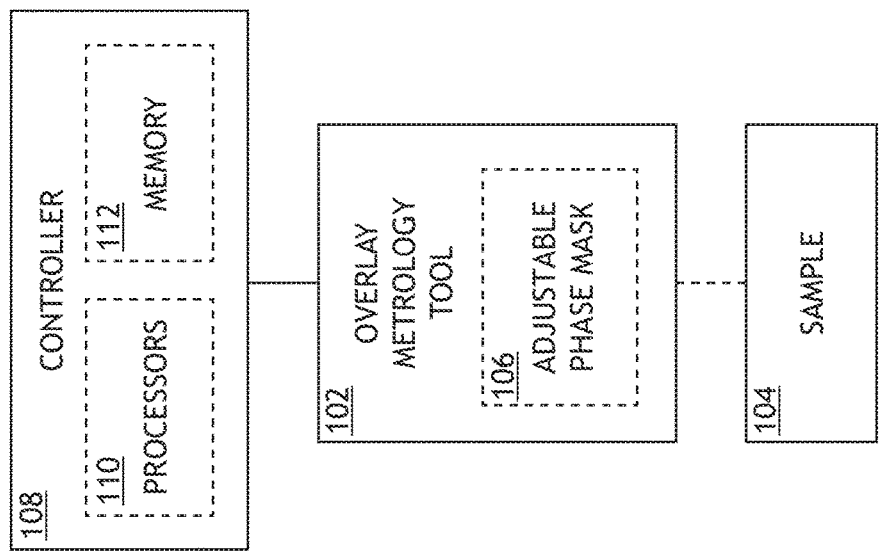
FIG. 1A is a conceptual view illustrating an overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for measuring overlay (e.g., overlay errors) between two or more lithographic patterning steps using multiple overlay metrology techniques with a common overlay metrology tool. Additional embodiments are directed to efficiently modifying illumination of the sample and/or collection of light from the sample during measurements to provide efficient switching between the overlay metrology techniques.

For the purposes of the present disclosure, the term overlay is generally used to describe relative positions of features on a sample fabricated by two or more lithographic patterning steps, where the term overlay error describes a deviation of the features from a nominal arrangement. For example, a multi-layered device may include features patterned on multiple sample layers using different lithography steps for each layer, where the alignment of features between layers must typically be tightly controlled to ensure proper performance of the resulting device. Accordingly, an overlay measurement may characterize the relative positions of features on two or more of the sample layers. By way of another example, multiple lithography steps may be used to fabricate features on a single sample layer. Such techniques, commonly called double-patterning or multiple-patterning techniques, may facilitate the fabrication of highly dense features near the resolution of the lithography system. An overlay measurement in this context may characterize the relative positions of the features from the different lithography steps on this single layer. It is to be understood that examples and illustrations throughout the present disclosure relating to a particular application of overlay metrology are provided for illustrative purposes only and should not be interpreted as limiting the disclosure.

While in some applications overlay measurements may be performed directly on features of a fabricated device (e.g., device features), overlay measurements are commonly performed on dedicated overlay targets printed using the same lithography steps as the device features. In this way, the features of an overlay target (e.g., target features) may be specially designed to facilitate overlay measurements. Further, overlay measured at one fabrication step (e.g., after the fabrication of one or more sample layers) may be used to generate correctables for precisely aligning a process tool (e.g., a lithography tool, or the like) for the fabrication of an additional sample layer in a subsequent fabrication step.

Various overlay metrology target designs, measurement techniques, and corresponding overlay metrology tools have been developed. For example, image-based overlay metrology tools may illuminate an overlay target (e.g., an advanced imaging metrology (AIM) target, a box-in-box metrology target, or the like) and capture an overlay signal including an image of the overlay target based on a variety of imaging techniques including, but not limited to, bright-field imaging or dark-field imaging. Accordingly, overlay may be determined by measuring the relative positions of the overlay target features in the captured image (e.g., a field plane distribution). By way of another example, scatterometry-based overly metrology tools may illuminate an overlay target (e.g., a grating-over-grating metrology target, or the like) and capture an overlay signal including an angular distribution of light emanating from the overlay target associated with diffraction, scattering, and/or reflection of the illumination beam. In this case, overlay may be determined based on the angular distribution of the captured light (e.g., a pupil plane distribution). Further, various diffraction-based overlay techniques, which may be based on imaging or scatterometry, may utilize specific diffraction orders generated by illuminating overlay targets having periodic features with controlled angular illumination profiles. Additionally, certain metrology techniques may be suitable for characterization of static targets, whereas others may be suitable for characterization of an overlay target while it is in motion.

However, a central challenge to the use of overlay targets is ensuring that the overlay measurement generated by the overlay target accurately represents the actual overlay over the device features. A target-based overlay measurement may deviate from an actual overlay of device features for various reasons. For instance, differences in size, orientation, density, or physical location between the target features and the device features may result in fabrication deviations that manifest as systematic errors in the overlay measurement. Additionally, different overlay techniques and target designs may have different tradeoffs between size, accuracy, illumination source requirements and measurement complexity or speed. As a result, it may be desirable to efficiently switch between different overlay metrology techniques based on the specific needs of a given measurement.

Embodiments of the present disclosure are directed to an overlay metrology tool including an adjustable pupil mask located in at least a collection pupil to dynamically adjust the transmission of light from the sample to a detector. In this regard, the adjustable pupil mask may facilitate dynamic control of the angular distribution of light in the system and may further facilitate switching between different overlay metrology techniques that may utilize light in different regions of the collection pupil.

The adjustable pupil mask may be configured in a variety of ways. In some embodiments, the adjustable pupil mask provides a spatially-adjustable transmissivity of light through the pupil. In this regard, the transmissivity of light through various portions of the pupil may be separately controlled. Further, the adjustable pupil mask may operate in a transmissive mode or a reflective mode.

Additional embodiments of the present disclosure are directed to an overlay metrology tool that additionally includes an adjustable pupil mask in an illumination pupil of the overlay metrology tool to dynamically adjust the angular distribution of illumination on the sample during a measurement. In some embodiments, the overlay metrology tool includes separate adjustable pupil masks located in non-overlapping illumination pupil and collection pupil planes. In some embodiments, the overlay metrology tool includes a single adjustable pupil mask in an overlapping illumination pupil and collection pupil plane. For example, an internal pupil plane of an objective lens used to simultaneously illuminate the sample and collect light from the sample may correspond to both an illumination pupil and a collection pupil. By way of another example, one or more relay optics may be used to relay the internal pupil plane of an objective lens to a desired location (e.g., outside the casing of the objective lens) to facilitate placement of the adjustable pupil mask.

Additional embodiments of the present disclosure are directed to an overlay metrology tool including structured illumination in a common illumination and collection pupil such as, but not limited to, an internal pupil plane of an objective lens used to simultaneously illuminate the sample and collect light from the sample. For example, the overlay metrology tool may include an illumination source that provides illumination in one or more fibers having output ends located at the common pupil. Further, the overlay metrology tool may include an adjustable pupil mask in portions of the pupil not obscured by the fibers.

It is contemplated herein that an overlay metrology tool including an adjustable pupil mask in at least a collection pupil may be suitable for measuring overlay of a sample using a wide range of overlay metrology techniques. For example, such an overlay metrology tool may be configurable to switch between image-based overlay techniques and scatterometry-based overlay techniques. Further, such an overlay metrology tool may be configurable, based on the adjustable pupil mask, to switch between measurements of a static sample or measurements of a sample in motion as it is scanned through a measurement field.

As a result, an overlay metrology tool including an adjustable pupil masks disclosed herein may provide a flexible platform for performing a variety of overlay measurement techniques. Such a tool may thus provide numerous benefits over existing tools. For example, such a tool may provide massive sampling of overlay targets distributed across a sample with selectable measurement recipes. This may enable the use of different overlay recipes (and potentially different target geometries) on different portions of a sample with a high measurement throughput. In contrast, the use of one or more overlay metrology tools that each provide overlay measurements using single dedicated techniques or recipes would require physically moving the sample between the various tools to carry out the different measurements, which would substantially decrease throughput.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

Additional embodiments of the present disclosure are directed to providing recipes for an overlay metrology tool suitable for providing required parameters for configuring the overlay metrology tool for any selected overlay measurement technique. An overlay metrology tool is typically configurable according to a recipe including a set of parameters for controlling the illumination of a sample as well as the collection of light from the sample. It is recognized herein that different overlay metrology techniques may require different illumination profiles of light on the sample and may further utilize light from different portions of the collection pupil for a measurement. For example, a recipe of an overlay metrology tool may include illumination parameters such as, but not limited to, an illumination wavelength, an illumination pupil distribution (e.g., a distribution of illumination angles and associated intensities of illumination at those angles), a polarization of incident illumination, a spatial distribution of illumination, or a sample height. By way of another example, a recipe of an overlay metrology tool may include collection parameters such as, but not limited to, a collection pupil distribution (e.g., a desired distribution of angular light from the sample to be used for a measurement and associated filtered intensities at those angles), collection field stop settings to select portions of the sample of interest, polarization of collected light, or wavelength filters.

In some embodiments, the overlay metrology recipe may include various settings for adjustable pupil masks in at least the collection pupil to facilitate selection of a desired overlay measurement technique. In some embodiments, different overlay metrology recipes are provided for different targets across a sample or a series of samples. In this way, different overlay metrology techniques may be utilized at different locations on the sample.

As an illustrative example, diffraction-based overlay metrology techniques may illuminate an overlay target having periodic features with illumination at a selected incidence angle, which results in the generation of distinct diffraction orders by the periodic overlay target. Selected diffraction orders may be then be collected for use in determining the overlay. Using this approach, the emission angles of the diffraction orders are based on factors such as the periodicity of the metrology target, the wavelength of the illumination, and the angle of illumination. Further, different techniques may utilize different combinations of illumination and collection configurations. In some embodiments, a single overlay metrology tool including an adjustable pupil mask in at least a collection pupil may be dynamically adjusted (e.g., during run-time) to provide overlay measurements using a variety of overlay metrology techniques.

Additional embodiments of the present disclosure are directed to providing overlay data to one or more process tools. Overlay data from an overlay metrology tool may generally include any output of an overlay metrology tool having sufficient information to determine overlay (or overlay errors) associated with various lithography steps. For example, overlay data may include, but is not required to include, one or more datasets, one or more images, one or more detector readings, or the like. This overlay data may then be used for various purposes including, but not limited to, diagnostic information of the lithography tools or for the generation of process-control correctables. For instance, overlay data for samples in a lot may be used to generate feedback correctables for controlling the lithographic exposure of subsequent samples in the same lot. In another instance, overlay data for samples in a lot may be used to generate feed-forward correctables for controlling lithographic exposures for the same or similar samples in subsequent lithography steps to account for any deviations in the current exposure.

Referring now to FIGS. 1 through 8, systems and methods for overlay metrology via selectable techniques is illustrated in greater detail in accordance with one or more embodiments of the present disclosure.

FIG. 1A is a conceptual view illustrating an overlay metrology system 100, in accordance with one or more embodiments of the present disclosure.

In one embodiment, the overlay metrology system 100 includes an overlay metrology tool 102 to acquire overlay signals from overlay targets based on any number of overlay recipes. For example, the overlay metrology tool 102 may direct illumination to a sample 104 and may further collect light or other radiation emanating from the sample 104 to generate an overlay signal suitable for the determination of overlay of two or more sample layers. The overlay metrology tool 102 may be any type of overlay metrology tool known in the art suitable for generating overlay signals suitable for determining overlay associated with overlay targets on a sample 104. The overlay metrology tool 102 may selectively operate in an imaging mode or a non-imaging mode. For example, in an imaging mode, individual overlay target elements may be resolvable within the illuminated spot on the sample (e.g., as part of a bright-field image, a dark-field image, or the like). By way of another example, the overlay metrology tool 102 may operate as a scatterometry-based overlay metrology tool in which radiation from the sample is analyzed at a pupil plane to characterize the angular distribution of radiation from the sample 104 (e.g., associated with scattering and/or diffraction of radiation by the sample 104).

Further, the overlay tool may be configurable to generate overlay signals based on any number of recipes defining measurement parameters for the acquiring an overlay signal suitable for determining overlay of an overlay target. For example, a recipe of an overlay metrology tool may include, but is not limited to, an illumination wavelength, a detected wavelength of light emanating from the sample, a spot size or shape of illumination on the sample, an angle of incident illumination, a polarization of incident illumination, a polarization of collected light, a position of a beam of incident illumination on an overlay target, a position of an overlay target in the focal volume of the overlay metrology tool, or the like.

In another embodiment, the overlay metrology tool 102 includes an adjustable pupil mask 106 in a pupil plane of at least a collection pathway of the overlay metrology tool 102. An adjustable pupil mask 106 in a collection pupil may dynamically adjust the intensity of light as a function of spatial position in the pupil plane that is directed towards the detector. In this regard, the adjustable pupil mask 106 may be used to dynamically select and/or reject particular diffraction orders generated by an overlay target on the sample 104 for use in a particular measurement. Similarly, an adjustable pupil mask 106 in an illumination pupil may dynamically adjust the intensity of light as a function of spatial position in the pupil plane that is directed towards the sample. In this regard, the adjustable pupil mask 106 may be used to dynamically control the angle of illumination incident on the sample and the associated intensity at each angle.

The adjustable pupil mask 106 may include any spatially-addressable optical elements known in the art. Further, the adjustable pupil mask 106 may operate in a reflection or a transmission mode. In this regard, the light passed by the pupil may be reflected and/or transmitted light from the adjustable pupil mask 106. For example, the adjustable pupil mask 106 may include a spatially-addressable device having spatially-addressable pixels such as, but not limited to, a liquid crystal device, a micro-electro-mechanical system (MEMS) device, or a programmable mirror array. By way of another example, the adjustable pupil mask 106 may be formed as one or more solid components (e.g., discs) that may be selectively inserted into the pupil.

In one embodiment, the adjustable pupil mask 106 selectively blocks or passes light through the pupil. In another embodiment, the adjustable pupil mask 106 provides selective control over the intensity of light passed through the pupil. For example, an adjustable pupil mask 106 including a liquid crystal device providing spatially-selectable polarization coupled with a polarizer may provide a spatially-selectable intensity profile of light passed through the pupil.

In another embodiment, the overlay metrology system 100 includes a controller 108.

The controller 108 may include one or more processors 110 configured to execute program instructions maintained on memory medium 112, or memory. In this regard, the one or more processors 110 of controller 108 may execute any of the various process steps described throughout the present disclosure. Further, the controller 108 may be communicatively coupled to the overlay metrology tool 102 or any component therein.

The one or more processors 110 of a controller 108 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 110 may include any device configured to execute algorithms and/or instructions (e.g., program instructions stored in memory). In one embodiment, the one or more processors 110 may be embodied as a desktop computer, mainframe computer system, workstation, image computer, parallel processor, networked computer, or any other computer system configured to execute a program configured to operate or operate in conjunction with the overlay metrology system 100, as described throughout the present disclosure Moreover, different subsystems of the overlay metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller 108 or, alternatively, multiple controllers. Additionally, the controller 108 may include one or more controllers housed in a common housing or within multiple housings. In this way, any controller or combination of controllers may be separately packaged as a module suitable for integration into the overlay metrology system 100.

The memory medium 112 may include any storage medium known in the art suitable for storing program instructions executable by the associated one or more processors 132. For example, the memory medium 112 may include a non-transitory memory medium. By way of another example, the memory medium 112 may include, but is not limited to, a read-only memory (ROM), a random-access memory (RAM), a magnetic or optical memory device (e.g., disk), a magnetic tape, a solid-state drive and the like. It is further noted that memory medium 112 may be housed in a common controller housing with the one or more processors 110. In one embodiment, the memory medium 112 may be located remotely with respect to the physical location of the one or more processors 110 and controller 108. For instance, the one or more processors 110 of controller 108 may access a remote memory (e.g., server), accessible through a network (e.g., internet, intranet and the like).

Figure 1B:
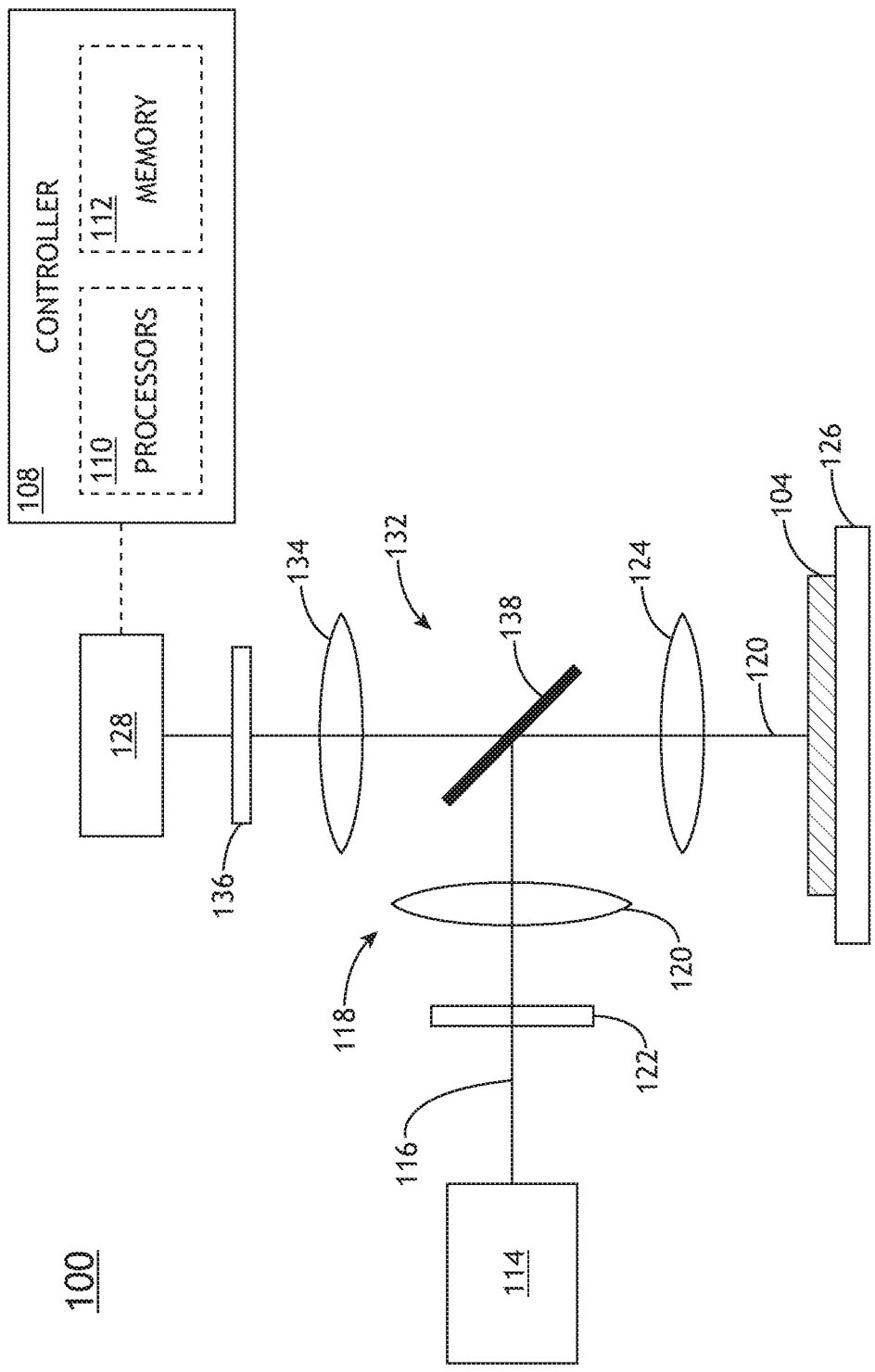
FIG. 1B is a conceptual view illustrating the overlay metrology tool, in accordance with one or more embodiments of the present disclosure.

FIG. 1B is a conceptual view illustrating the overlay metrology tool 102, in accordance with one or more embodiments of the present disclosure. In one embodiment, the overlay metrology tool 102 includes an illumination source 114 configured to generate at least one illumination beam 116. The illumination from the illumination source 114 may include one or more selected wavelengths of light including, but not limited to, ultraviolet (UV) radiation, visible radiation, or infrared (IR) radiation. For example, the overlay metrology tool 102 may include one or more apertures at an illumination pupil plane to divide illumination from the illumination source 114 into one or more illumination beams 116 or illumination lobes. In this regard, the overlay metrology tool 102 may provide dipole illumination, quadrature illumination, or the like. Further, the spatial profile of the one or more illumination beams 116 on the sample 104 may be controlled by a field-plane stop to have any selected spatial profile.

The illumination source 114 may include any type of illumination source suitable for providing at least one illumination beam 116. In one embodiment, the illumination source 114 is a laser source. For example, the illumination source 114 may include, but is not limited to, one or more narrowband laser sources, a broadband laser source, a supercontinuum laser source, a white light laser source, or the like. In this regard, the illumination source 114 may provide an illumination beam 116 having high coherence (e.g., high spatial coherence and/or temporal coherence). In another embodiment, the illumination source 114 includes a laser-sustained plasma (LSP) source. For example, the illumination source 114 may include, but is not limited to, a LSP lamp, a LSP bulb, or a LSP chamber suitable for containing one or more elements that, when excited by a laser source into a plasma state, may emit broadband illumination. In another embodiment, the illumination source 114 includes a lamp source. For example, the illumination source 114 may include, but is not limited to, an arc lamp, a discharge lamp, an electrode-less lamp, or the like. In this regard, the illumination source 114 may provide an illumination beam 116 having low coherence (e.g., low spatial coherence and/or temporal coherence). In another embodiment, the illumination source 114 includes a high-brightness illumination source formed from multiple coherent sources into a single output distribution. For example, a high-brightness illumination source including multiple coherent sources configured to provide a single output distribution in a common etendue is generally described in U.S. patent application Ser. No. 16/430,861 filed on Jun. 4, 2019, which is incorporated herein by reference in its entirety.

The illumination source 114 may provide an illumination beam 116 using free-space techniques and/or optical fibers. In one embodiment, the illumination source 114 generates a multi-lobe illumination beam 116 by providing light in two or more optical fibers, where light output from each optical fiber is an illumination lobe of the illumination beam 116. In another embodiment, the illumination source 114 generates a multi-lobe illumination beam 116 by diffracting a light source into two or more diffraction orders, where the illumination lobes of the illumination beam 116 are formed from at least some of the diffraction orders of the light source. Efficient generation of multiple illumination lobes through controlled diffraction is generally described in U.S. Patent Publication No. US2020/0124408 published on Mar. 14, 2019 and titled Efficient Illumination Shaping for Scatterometry Overlay, which is incorporated herein by reference in its entirety.

In another embodiment, the overlay metrology tool 102 directs the illumination beam 116 to the sample 104 via an illumination pathway 118. The illumination pathway 118 may include one or more optical components suitable for modifying and/or conditioning the illumination beam 116 as well as directing the illumination beam 116 to the sample 104. In one embodiment, the illumination pathway 118 includes one or more illumination-pathway lenses 120 (e.g., to collimate the illumination beam 116, to relay pupil and/or field planes, or the like). In another embodiment, the illumination pathway 118 includes one or more illumination-pathway optics 122 to shape or otherwise control the illumination beam 116. For example, the illumination-pathway optics 122 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In another embodiment, the overlay metrology tool 102 includes an objective lens 124 to focus the illumination beam 116 onto the sample 104 (e.g., an overlay target with overlay target elements located on two or more layers of the sample 104). In another embodiment, the sample 104 is disposed on a sample stage 126 suitable for securing the sample 104 and further configured to position the sample 104 with respect to the illumination beam 116.

In another embodiment, the overlay metrology tool 102 includes one or more detectors 128 configured to capture light or other emanating from the sample 104 (e.g., an overlay target on the sample 104) (e.g., collected light 130) through a collection pathway 132. The collection pathway 132 may include one or more optical elements suitable for modifying and/or conditioning the collected light 130 from the sample 104. In one embodiment, the collection pathway 132 includes one or more collection-pathway lenses 134 (e.g., to collimate the illumination beam 116, to relay pupil and/or field planes, or the like), which may include, but is not required to include, the objective lens 124. In another embodiment, the collection pathway 132 includes one or more collection-pathway optics 136 to shape or otherwise control the collected light 130. For example, the collection-pathway optics 136 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

A detector 128 may be located at any selected location within the collection pathway 132. In one embodiment, the overlay metrology tool 102 includes a detector 128 at a field plane (e.g., a plane conjugate to the sample 104) to generate an image of the sample 104. In another embodiment, the overlay metrology tool 102 includes a detector 128 at a pupil plane (e.g., a diffraction plane) to generate a pupil image. In this regard, the pupil image may correspond to an angular distribution of light from the sample 104 detector 128. For instance, diffraction orders associated with diffraction of the illumination beam 116 from the sample 104 (e.g., an overlay target on the sample 104) may be imaged or otherwise observed in the pupil plane. In a general sense, a detector 128 may capture any combination of reflected (or transmitted), scattered, or diffracted light from the sample 104.

The overlay metrology tool 102 may generally include any number or type of detectors 128 suitable for capturing light from the sample 104 indicative of overlay. In one embodiment, the detector 128 includes one or more detectors 128 suitable for characterizing a static sample. In this regard, the overlay metrology tool 102 may operate in a static mode in which the sample 104 is static during a measurement. For example, a detector 128 may include a two-dimensional pixel array such as, but not limited to, a charge-coupled device (CCD) or a complementary metal-oxide semiconductor (CMOS) device. In this regard, the detector 128 may generate a two-dimensional image (e.g., a field-plane image or a pupil-plan image) in a single measurement.

In one embodiment, the detector 128 includes one or more detectors 128 suitable for characterizing a moving sample (e.g., a scanned sample). In this regard, the overlay metrology tool 102 may operate in a scanning mode in which the sample 104 is scanned with respect to a measurement field during a measurement. For example, the detector 128 may include a 2D pixel array with a capture time and/or a refresh rate sufficient to capture one or more images during a scan within selected image tolerances (e.g., image blur, contrast, sharpness, or the like). By way of another example, the detector 128 may include a line-scan detector to continuously generate an image one line of pixels at a time. By way of another example, the detector 128 may include a time-delay integration (TDI) detector. A TDI detector may generate a continuous image of the sample 104 when the motion of the sample 104 is synchronized to charge-transfer clock signals in the TDI detector. In particular, a TDI detector acquires charge from light exposure on columns of pixels and includes clock pulses to transfer charge between adjacent columns of pixels along a scan direction. When the motion of the sample 104 along the scan direction is synchronized to the charge transfer in the TDI detector, charge continuously accumulates during the scan. This process continues until the charge reaches a final column of pixels and is subsequently read out of the detector. In this way, images of the object are accumulated over a longer time frame than would be possible with a simple line scan camera. This relatively longer acquisition time decreases the photon noise level in the image. Further, synchronous motion of the image and charge prevents blurring in the recorded image.

In another embodiment, the overlay metrology tool 102 includes a scanning sub-system to scan the sample 104 with respect to the measurement field during a metrology measurement. For example, the sample stage 126 may position and orient the sample 104 within a focal volume of the objective lens 124. In another embodiment, the sample stage 126 includes one or more adjustable stages such as, but not limited to, a linear translation stage, a rotational stage, or a tip/tilt stage. In another embodiment, though not shown, the scanning sub-system includes one or more beam-scanning optics (e.g., rotatable mirrors, galvanometers, or the like) to scan the illumination beam 116 with respect to the sample 104).

The illumination pathway 118 and the collection pathway 132 of the overlay metrology tool 102 may be oriented in a wide range of configurations suitable for illuminating the sample 104 with the illumination beam 116 and collecting light emanating from the sample 104 in response to the incident illumination beam 116. For example, as illustrated in FIG. 1B, the overlay metrology tool 102 may include a beamsplitter 138 oriented such that a common objective lens 124 may simultaneously direct the illumination beam 116 to the sample 104 and collect light from the sample 104. By way of another example, the illumination pathway 118 and the collection pathway 132 may contain non-overlapping optical paths.

Figure 1C:
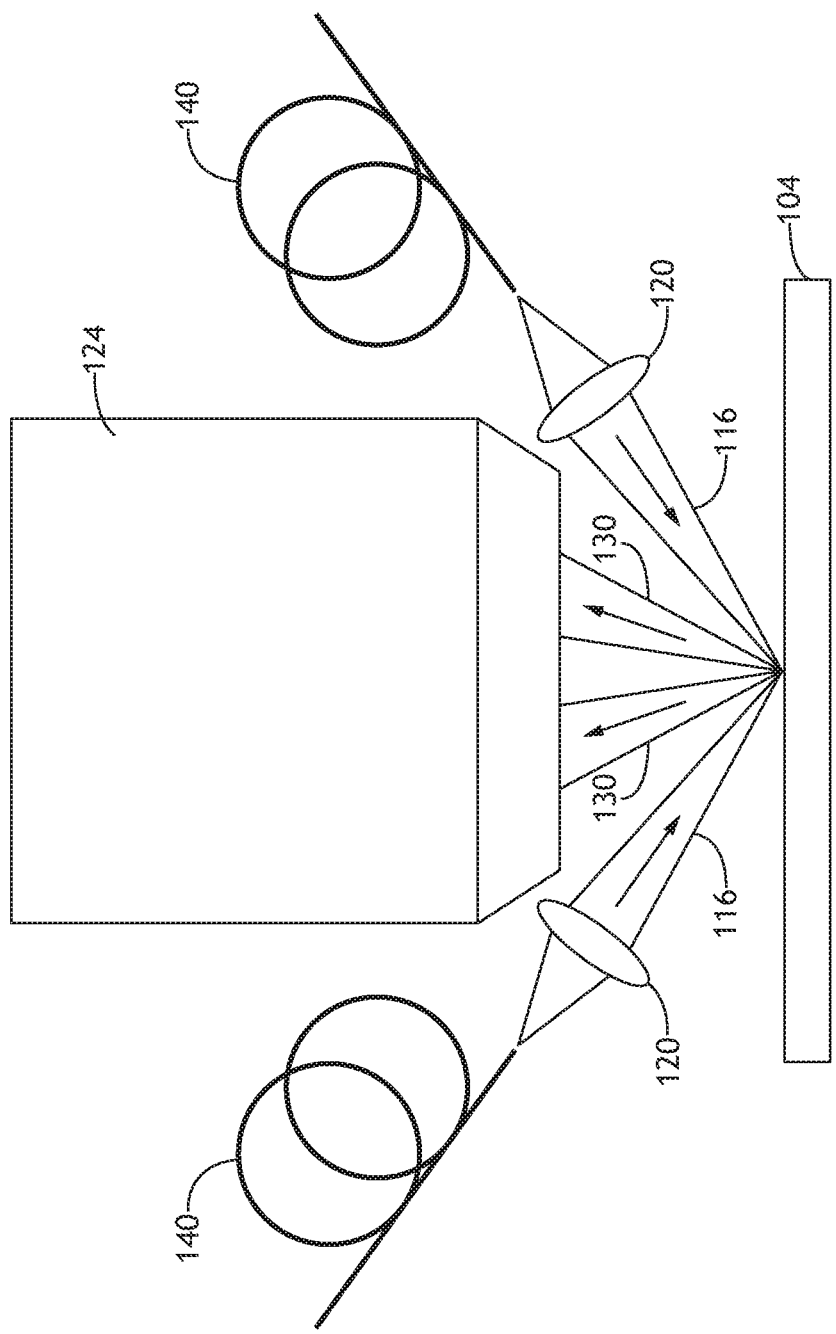
FIG. 1C is a conceptual view of a portion of an overlay metrology tool illustrating outside the lens illumination, in accordance with one or more embodiments of the present disclosure.

FIG. 1C is a conceptual view of a portion of an overlay metrology tool 102 illustrating outside-the lens illumination, in accordance with one or more embodiments of the present disclosure. In one embodiment, the illumination source 114 provides one or more illumination beams 116 from the outputs of one or more optical fibers 140 and illumination-pathway lenses 120 to direct the illumination beams 116 to the sample 104 at angles larger than the numerical aperture of an objective lens 124 used to receive the collected light 130. In this configuration, the objective lens 124 does not collect specular reflection (e.g., 0-order diffraction) from the sample 104.

Figure 1D:
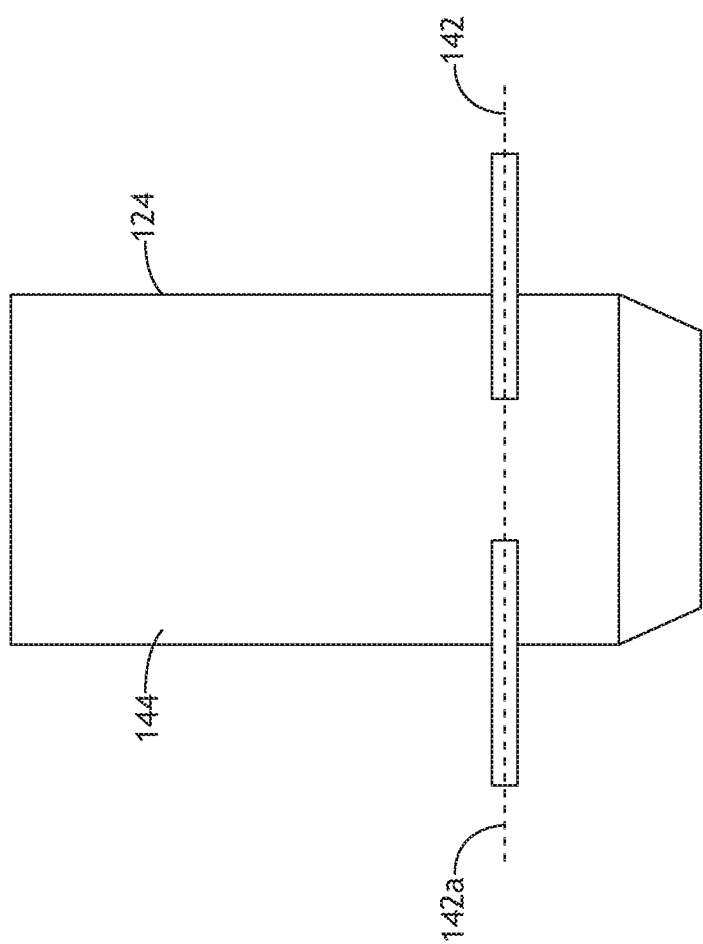
FIG. 1D is a conceptual view of an objective lens including direct access to an internal pupil plane through one or more slits in the casing, in accordance with one or more embodiments of the present disclosure.
Figure 1E:
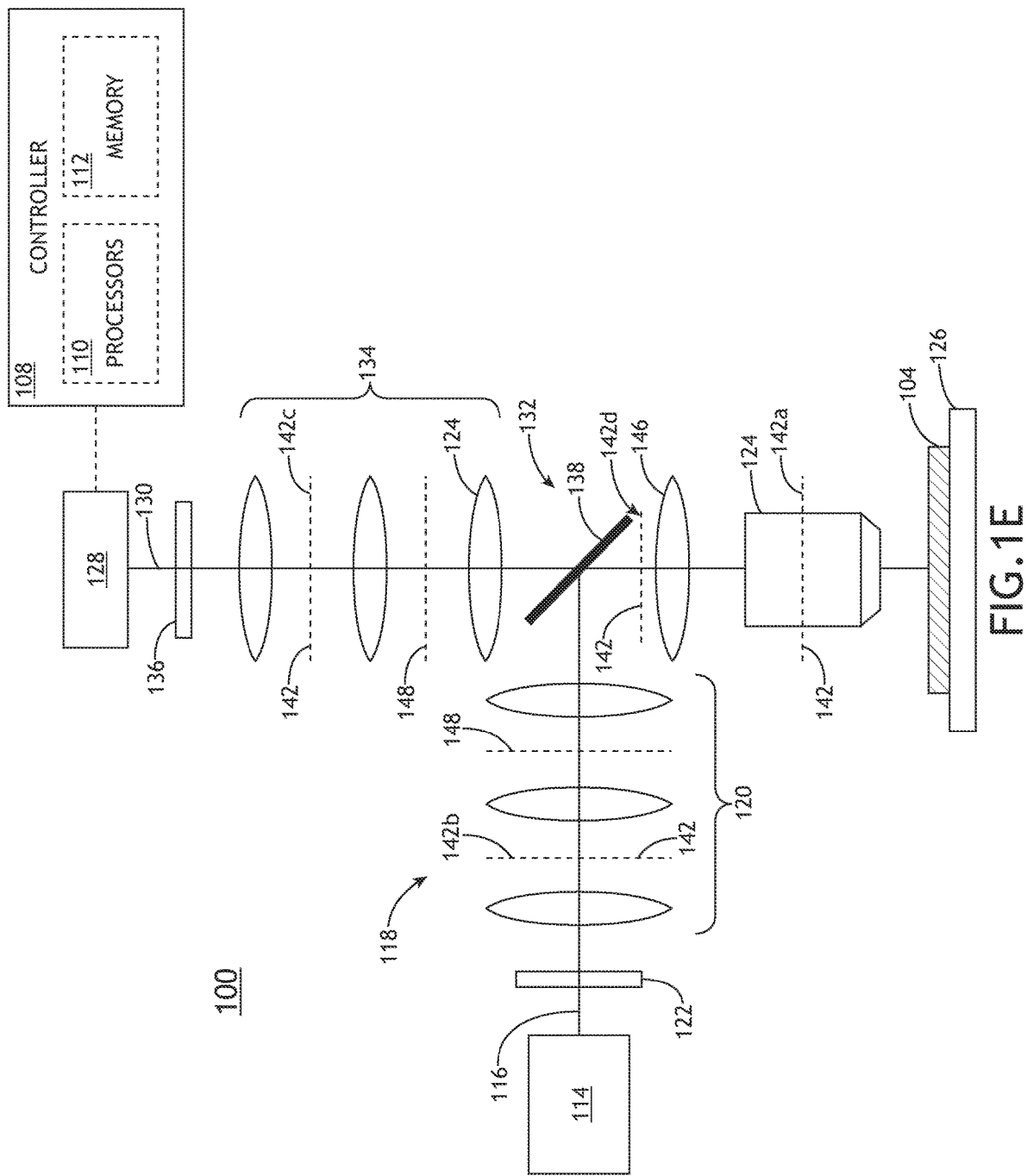
FIG. 1E is a conceptual view of an overlay metrology tool illustrating multiple pupil planes in accordance with one or more embodiments of the present disclosure.

Referring now to FIGS. 1D and 1E, it is contemplated herein that the overlay metrology tool 102 may include any number of pupil planes 142 and that an adjustable pupil mask may be placed at any number of the pupil planes.

In one embodiment, a telecentric pupil plane 142a is internally located within the objective lens 124. It is recognized herein that the pupil plane of an objective lens 124 may be, but is not required to be, within the casing 144 of the objective lens 124. FIG. 1D is a conceptual view of an objective lens 124 including direct access to the internal pupil plane 142a through one or more slits in the casing 144, in accordance with one or more embodiments of the present disclosure. In this arrangement, the pupil plane 142a is located in both the illumination pathway 118 and the collection pathway 132 such that an adjustable pupil mask 106 at this location would simultaneously impact both the angular illumination profile of the sample 104 and the angular profile of collected light 130 directed to the detector 128.

FIG. 1E is a conceptual view of an overlay metrology tool 102 illustrating multiple pupil planes 142 in accordance with one or more embodiments of the present disclosure. The overlay metrology tool 102 may further include one or more relayed pupil plane 142 in any combination of the illumination pathway 118 and the collection pathway 132. For example, the illumination-pathway lenses 120 may be configured to relay the internal telecentric pupil plane 142a of the objective lens 124 to the pupil plane 142b in the illumination pathway 118. An adjustable pupil mask 106 at this location would operate solely to manipulate the illumination of the sample 104. By way of another example, the collection-pathway lenses 134 may be configured to relay the internal telecentric pupil plane 142a of the objective lens 124 to the pupil plane 142c in the collection pathway 132. An adjustable pupil mask 106 at this location would operate solely to manipulate the collected light 130 from the sample 104 passed to the detector 128. By way of another example, the overlay metrology tool 102 may include one or more relay lenses 146 configured to relay the internal telecentric pupil plane 142a of the objective lens 124 to a pupil plane 142d common to both the illumination pathway 118 and the collection pathway 132. An adjustable pupil mask 106 at this location would simultaneously impact both the angular illumination profile of the sample 104 and the angular profile of collected light 130 directed to the detector 128.

Additionally, the overlay metrology tool 102 may include one or more optical elements configured to generate one or more field planes 148 in the illumination pathway 118 and/or the collection pathway 132.

As described previously herein, the overlay metrology tool 102 may be configurable to generate overlay signals associated with overlay targets on the sample 104 using any number of overlay recipes (e.g., sets of measurement parameters). Further, the overlay metrology tool 102 may provide rapid tuning of the measurement parameters such that multiple overlay signals based on different recipes may be rapidly acquired. For example, the controller 108 of the overlay metrology system 100 may be communicatively coupled with one or more adjustable components of the overlay metrology tool 102 to configure the adjustable components in accordance with an overlay recipe.

An overlay recipe may include one or more aspects of the spectrum of the illumination beam 116 incident on the sample such as, but not limited to the wavelength (e.g., the central wavelength), the bandwidth, and the spectral profile of the illumination beam 116 as measurement parameters.

An overlay recipe may further include a sampling mode. For example, the recipe may include whether a particular measurement should include capture of a field-plane image, a pupil plane, or both. Accordingly, the controller 108 may be communicatively coupled to one or more detectors 128 located at various planes in the overlay metrology tool 102 to adjust the image plane(s) in accordance with the overlay recipe. By way of another example, the recipe may include whether a particular measurement may be generated in a static mode or a scanning mode of operation. Accordingly, the controller 108 may be communicatively coupled to the scanning sub-system (e.g., one or more detectors 128, the sample stage 126, or the like) to adjust the position and/or motion of the sample 104 during a measurement in accordance with the overlay recipe.

Figure 2:
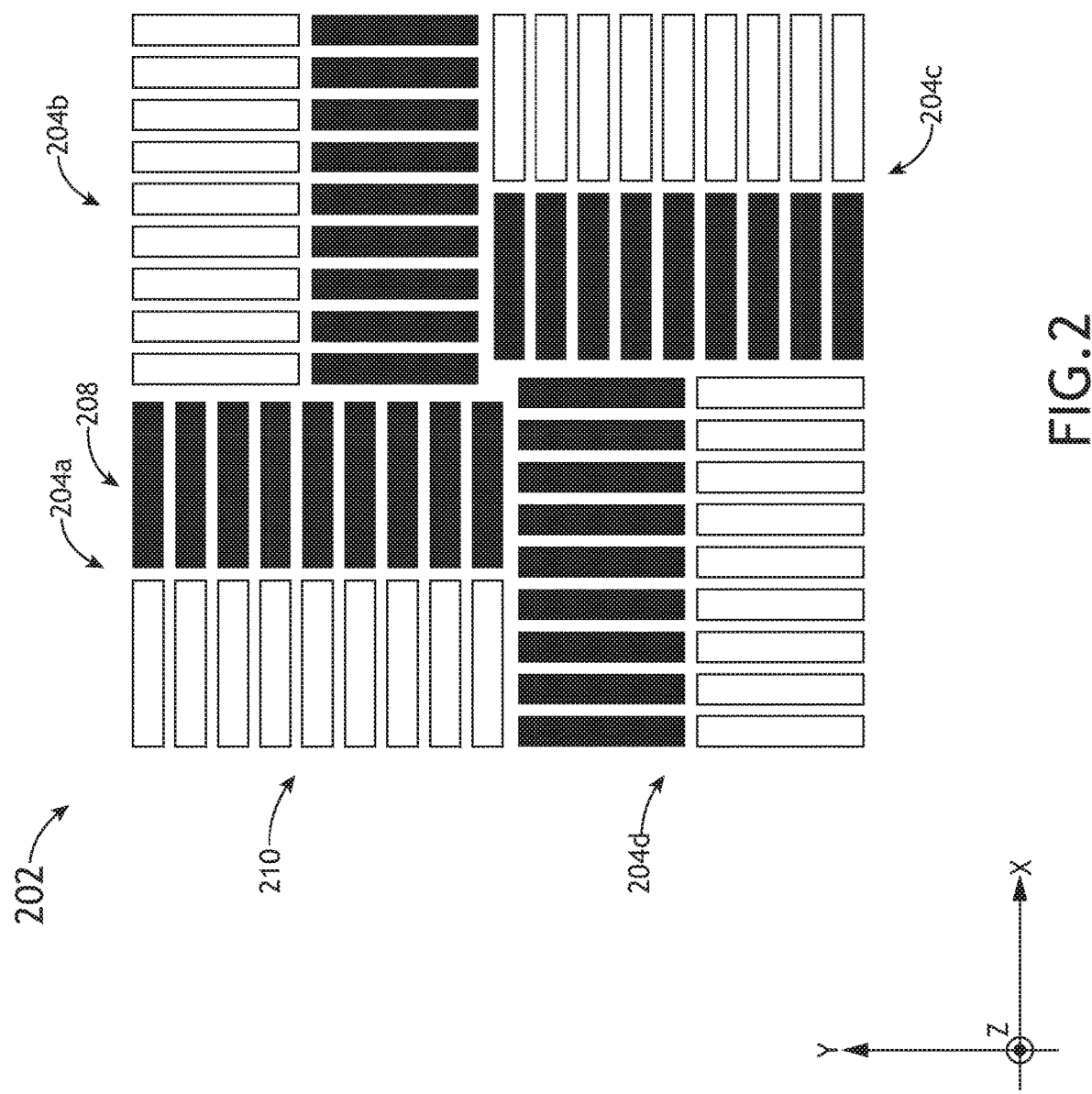
FIG. 2 is a top view of an overlay target with non-overlapping features, in accordance with one or more embodiments of the present disclosure.
Figure 3:
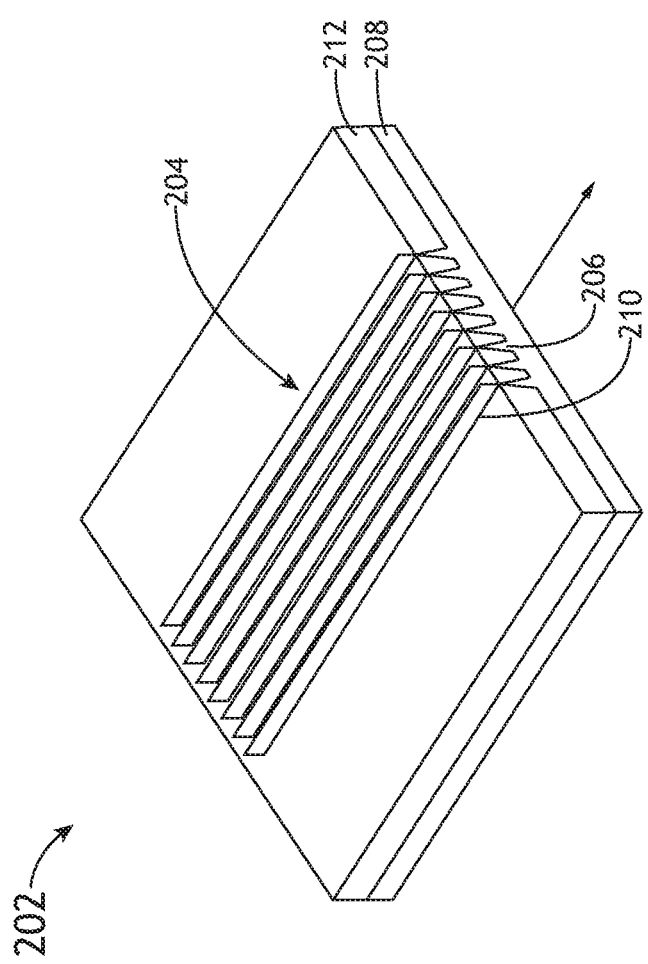
FIG. 3 is a perspective view of an overlay target with overlapping structures, in accordance with one or more embodiments of the present disclosure.

Referring now to FIGS. 2A through 3, overlay targets suitable for characterization with the overlay metrology tool 102 are described in greater detail in accordance with one or more embodiments of the present disclosure.

The overlay metrology tool 102 may generally be suitable for characterizing any type of overlay target having any design. In particular, various components of the overlay metrology tool 102 such as, but not limited to, the illumination source 114, the adjustable pupil mask 106, or the detectors 128, may be adjusted in accordance with an overlay recipe based on the particular design of the overlay target to be measured. In some embodiments, an overlay target includes periodic features on at least one sample layer that diffract the incident illumination beam 116. Accordingly, the light collected by objective lens 124 may include one or more diffraction orders from the overlay target.

FIG. 2 is a top view of an overlay target 202 with non-overlapping features, in accordance with one or more embodiments of the present disclosure. For example, the overlay target 202 in FIG. 2 may be suitable for image-based overlay or various diffraction-based overlay methods. In one embodiment, the overlay target 202 includes four cells 204a-d, represented here as quadrants of the overlay target 202. Each cell 204a-d may include first-layer printed elements 206 located on a first layer 208 of the sample 104 and second-layer printed elements 210 located on a second layer 212 of the sample 104.

Further, cell 204b and cell 204d may be configured to provide overlay measurements along the X direction as illustrated in FIG. 2. For instance, an overlay measurement along the X direction may be made by directly comparing relative positions of the first-layer printed elements 206 and the second-layer printed elements 210 within each cell or between cell 204b and cell 204d. In another instance, an overlay measurement along the X direction may be made by comparing a point of rotational symmetry (e.g., rotational symmetry, reflection symmetry, mirror symmetry, or the like) between first-layer printed elements 206 distributed across cell 204b and cell 204d with a point of symmetry between second-layer printed elements 210 distributed across cell 204b and cell 204d. Similarly, cell 204a and cell 204c may be configured to provide overlay measurements along the Y direction as illustrated in FIG. 2.

FIG. 3 is a perspective view of an overlay target 202 with overlapping structures, in accordance with one or more embodiments of the present disclosure. For example, the overlay target 202 in FIG. 3 may be suitable for scatterometry overlay measurements. In one embodiment, at least a portion of the second-layer printed elements 210 overlap the first-layer printed elements 206.

Further, an overlay target 202 may include, but is not required to include, periodic features. In this regard, as described previously herein, illuminating the overlay target 202 with an illumination beam 116 at a single incidence angle (or narrow range of incidence angles) may generate distinct diffraction orders based on diffraction from the periodic features. For example, the first-layer printed elements 206 and the second-layer printed elements 210 in FIGS. 2A through 3 are all periodic in the X and/or Y directions.

It is to be understood that the FIGS. 2 and 3 are provided solely for illustrative purposes and should not be interpreted as limiting. As described previously herein, the overlay metrology tool 102 may generally characterize an overlay target having any design of pattern elements in an imaging mode (e.g., with a detector 128 located at a field plane) or in scatterometry mode (e.g., with a detector 128 in a pupil plane). Further, the overlay metrology tool 102 may generally characterize the overlay target in a static acquisition mode or while the overlay target is in motion. Accordingly, the particular arrangements of pattern elements illustrated in FIGS. 2 and 3B are merely exemplary.

Figure 4B:
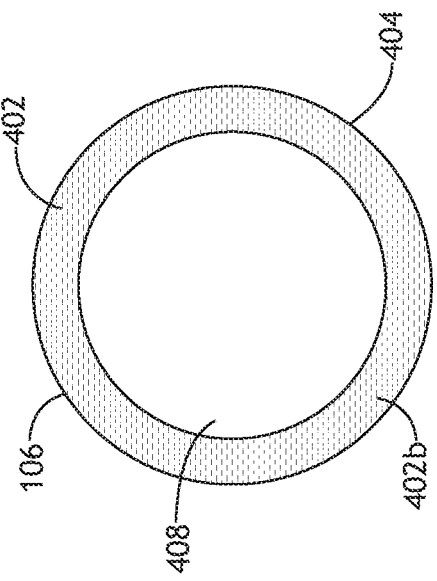
FIG. 4B is a schematic view of an adjustable pupil mask providing an annular control zone, in accordance with one or more embodiments of the present disclosure.
Figure 4C:
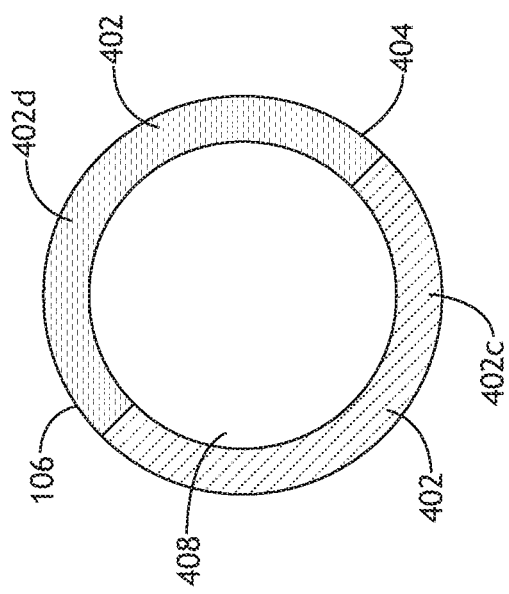
FIG. 4C is a schematic view of an adjustable pupil mask providing two control zones that combine to form an annulus, in accordance with one or more embodiments of the present disclosure.
Figure 4A:
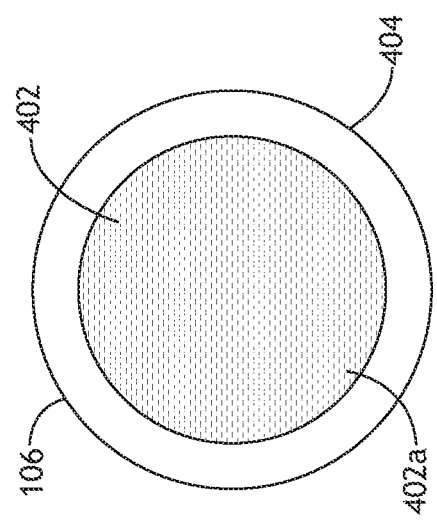
FIG. 4A is a schematic view of an adjustable pupil mask providing a shaped control zone in the pupil plane, in accordance with one or more embodiments of the present disclosure.

Referring now to FIGS. 4A through 4C, various configurations of an adjustable pupil mask 106 are described in greater detail in accordance with one or more embodiments of the present disclosure.

The adjustable pupil mask 106 may include any type of spatially-addressable optical element known in the art including, but not limited to, one or more mechanical shutters, one or more neutral density filters, one or more electro-optical shutters, one or more spatial light modulators, one or more deformable mirrors, one or more liquid crystal devices, or one or more polarizers. Further, the adjustable pupil mask 106 may operate in a reflection or a transmission mode. In this regard, the light passed by the pupil may be reflected and/or transmitted light from the adjustable pupil mask 106. It is to be understood that references in the present to disclosure to transmission of light through a pupil plane 142 or transmissivity are provided solely for illustrative purposes and should not be interpreted as limiting. Rather, such examples should be interpreted to relate broadly to operation in either a reflection or a transmission mode.

The adjustable pupil mask 106 may control the transmission of light through the pupil plane 142 with any selected degree of spatial resolution. For example, the adjustable pupil mask 106 may have one or more independently-controllable areas in which the transmission of light through the pupil plane 142 may be separately controlled. For instance, the adjustable pupil mask 106 may include a spatially-addressable device having addressable pixels such as, but not limited to, liquid crystal device, a micro-electro-mechanical system (MEMS) device, or a programmable mirror array. In this regard, the adjustable pupil mask 106 may control the transmission of light through the pupil plane 142 with the spatial resolution of the spatially-addressable device. In another instance, the adjustable pupil mask 106 may include one or more solid components (e.g., shutters) that may be selectively inserted into the pupil.

Additionally, the adjustable pupil mask 106 may control the transmission of light using various mechanisms. In one embodiment, the adjustable pupil mask 106 selectively blocks or passes all light at a given location in the pupil plane 142 (e.g., binary operation). For example, binary operation may generally be achieved through the use of any type of shutter or spatially-addressable device. It is contemplated herein that binary operation may be suitable for selectively blocking light in certain regions of the pupil plane 142 including, but not limited to, blocking selected diffraction orders of light to achieve a desired overlay metrology technique. In another embodiment, the adjustable pupil mask 106 provides controllable attenuation or filtering of light through the pupil plane 142. For example, controllable attenuation may be achieved by, but is not limited to, a polarizer coupled to a polarization rotator (e.g., an electro-optical polarization rotator, a spatial light modulator, a liquid-crystal device, or the like). In this regard, the polarization rotator may selectively rotate a polarization of light in all or a portion of the pupil plane 142 to provide an adjustable transmissivity through the polarizer.

The adjustable pupil mask 106 may further control of the transmission of light across any selected portion of the pupil plane 142. For the purposes of the present disclosure, the adjustable pupil mask 106 is described as controlling the transmission of light through one or more control zones 402 across the pupil plane 142. In this regard, the transmission of light through each control zone 402 may be independently controlled. Each control zone 402 may correspond to one or more spatially-addressable devices associated with the adjustable pupil mask 106 or portions thereof. For example, a control zone 402 may correspond to a shape of a shutter (e.g., a mechanical shutter, an electro-optic shutter, or the like). By way of another example, a control zone 402 may correspond to a group of pixels controlled as a group. For instance, in the case of an adjustable pupil mask 106 formed from a liquid crystal device having multiple pixels coupled to a polarizer, a control zone 402 may be formed as a group of pixels of the liquid crystal device controlled as a group.

FIGS. 4A through 4C illustrate three non-limiting examples of how an adjustable pupil mask 106 may be configured to provide control of various control zones 402 distributed throughout the pupil plane 142. It is contemplated herein that any configuration of the adjustable pupil mask 106 may be used at any pupil plane 142 in an overlay metrology tool 102 (e.g., any of pupil planes 142a-d illustrated in FIG. 1E). It is to be understood that particular examples below are provided solely for illustrative purposes as possible configurations and should not be interpreted as limiting. Further, although FIG. 4A through 4C are illustrated as separate configurations, in some embodiments, the adjustable pupil mask 106 includes all of the control zones 402a-d. In this regard, a single adjustable pupil mask 106 may be selectively adjusted to provide any of the configurations in FIGS. 4A-4C.

FIG. 4A is a schematic view of an adjustable pupil mask 106 providing a shaped control zone 402a in the pupil plane 142, in accordance with one or more embodiments of the present disclosure. As illustrated in FIG. 4A, the control zone 402a may lie within the pupil boundary 404 corresponding to the maximum angular extent of light through the overlay metrology tool 102. The control zone 402a may have any size or shape including, but not limited to, a circle as illustrated in FIG. 4A. Further, the control zone 402a may be, but is not required to be, centered within the pupil boundary 404. The adjustable pupil mask 106 in FIG. 4A may be well-suited for, but not limited to, overlay metrology techniques requiring blocking of selected diffraction orders from the sample 104 or grey-mode imaging in which 0-order light from the sample 104 is attenuated. For example, grey-mode scatterometry metrology is generally described in U.S. Patent Publication No. 2012/0004439 published on Jan. 3, 2019, which is incorporated herein by reference in its entirety.

FIG. 4B is a schematic view of an adjustable pupil mask 106 providing an annular control zone 402, in accordance with one or more embodiments of the present disclosure. The annular control zone 402 may have any width 406 and may further be located at any position within the pupil boundary 404. For example, as illustrated in FIG. 4B, the control zone 402b is centered in the pupil boundary 404 and extends inwards from the pupil boundary 404, leaving an unobscured central region 408. The adjustable pupil mask 106 of FIG. 4B may be well-suited for, but not limited to, blocking or attenuating selected diffracted orders at known radial positions in the pupil plane 142.

A adjustable pupil mask 106 such as those illustrated in FIGS. 4A and 4B may be well-suited for, but are not limited to, placement in a pupil plane 142 dedicated to either the illumination pathway 118 or the collection pathway 132 (e.g., the pupil planes 142b,c in FIG. 1E). For example, a symmetric adjustable pupil mask 106 in a collection pupil may block or attenuate diffraction orders at selected radii in the pupil plane 142 along orthogonal directions (e.g., the X and Y directions) to facilitate simultaneous overlay measurements in the X and Y directions under any illumination conditions including, but not limited to, normal illumination or symmetric illumination (e.g., dipole illumination, quadrupole illumination, annular illumination, or the like).

However, it may be desirable for some overlay metrology techniques to provide sequential illumination of symmetrically-opposed illumination beams 116 along a measurement direction. For example, it may be desirable to perform two measurements in which the sample is sequentially illuminated with the opposing beams of a dipole or other symmetric distribution.

FIG. 4C is a schematic view of an adjustable pupil mask 106 providing two control zones 402 that combine to form an annulus, in accordance with one or more embodiments of the present disclosure. In one embodiment, as illustrated in FIG. 4C, the adjustable pupil mask 106 includes a first control zone 402c and a second control zone 402d that combine to form an annulus similar to that illustrated in FIG. 4B. However, in this case, the two control zones 402c,d are separately controllable. The adjustable pupil mask 106 in FIG. 4C may be well-suited for placement in a pupil plane 142 shared by the illumination pathway 118 and the collection pathway 132 (e.g., the pupil planes 142a,d in FIG. 1E). In this regard, the adjustable pupil mask 106 may be suitable for, but is not limited to, sequential illumination with opposing beams of a dipole or other symmetric distribution.

Further, the control zones 402c,d may be oriented at any selected angle. In one embodiment, as illustrated in FIG. 4C, the control zones 402c,d are oriented at a 45-degree angle with respect to orthogonal measurement directions (e.g., the X and Y directions) to facilitate simultaneous illumination of the sample with orthogonal illumination beams 116.

FIGS. 5A and 5B illustrate the use of an adjustable pupil mask 106 with multiple control zones 402 located in a pupil plane 142 common to the illumination pathway 118 and collection pathway 132 (e.g., either of pupil plane 142a,d in FIG. 1E) for sequential illumination. FIG. 5A is a schematic view of the adjustable pupil mask 106 in FIG. 4C configured with a first recipe to provide a first measurement, in accordance with one or more embodiments of the present disclosure. FIG. 5B is a schematic view of the adjustable pupil mask 106 in FIG. 4C configured with a second recipe to provide a second measurement, in accordance with one or more embodiments of the present disclosure.

In FIGS. 5A-5C, the illumination pathway 118 provides four illumination beams 116a-d, where illumination beams 116a,b provide dipole illumination along the X direction and illumination beams 116c,d provide dipole illumination along the Y direction. Further, FIGS. 5A-5C illustrate the presence of discrete diffraction orders generated by illumination of an overlay metrology target having periodic features in both the X and Y directions such as, but not limited to the overlay target 202 in FIG. 2 or 3.

In FIG. 5A, the first control zone 402c is transparent to allow illumination beams 116a,c (e.g., one beam in each of the X and Y directions) to illuminate the sample 104, and the second control zone 402d is fully opaque to block the other illumination beams 116b,d. The adjustable pupil mask 106 further controls the distribution of collected light 130 that may be passed through to the detector 128. For example, the opaque second control zone 402d may block 0-order diffraction 502a from the illumination beam 116a, but non-zero diffraction orders 504a,506a may pass through the unobscured central region 408. Similarly, the opaque second control zone 402d may block 0-order diffraction 502c from the illumination beam 116c, but non-zero diffraction orders 504c,506c may pass through the unobscured central region 408.

In FIG. 5B, the properties of the control zones 402c,d are reversed such that the first control zone 402c is opaque to block or attenuate illumination beams 116a,c and the second control zone 402d is transparent to allow the illumination beams 116b,d to illuminate the sample 104. In this case, the opaque first control zone 402c will block the 0-order diffraction 502b from the illumination beam 116b, but non-zero diffraction orders 504b,506b may pass through the unobscured central region 408. Similarly, the opaque second control zone 402c may block 0-order diffraction 502d from the illumination beam 116d, but non-zero diffraction orders 504d,506d may pass through the unobscured central region 408.

As illustrated by FIGS. 5A and 5B, placement of an adjustable pupil mask 106 with multiple control zones 402 in a pupil plane 142 common to both an illumination pathway 118 and a collection pathway 132 may provide flexible control of both the illumination beams 116 and collected light 130. Further, such an adjustable pupil mask 106 allows for sequential illumination with different illumination and/or collection profiles such that a wide variety of overlay metrology techniques may be performed using a single system. However, it is to be understood that FIGS. 5A and 5B are provided herein solely for illustrative purposes and should not be interpreted as limiting. It is contemplated herein that an adjustable pupil mask 106 may have any number of control zones 402 oriented in a variety of configurations to accommodate one or more overlay metrology techniques of interest.

It is contemplated herein that sequential illumination (e.g., as illustrated in FIGS. 5A and 5B) may be carried out using any technique known in the art. For example, if a sample 104 is stationary, multiple sequential measurements may be carried out on an overlay target prior to moving the sample 104 for the measurement of another target. Further, various techniques for providing multiple measurements of overlay targets on a moving sample 104 may be implemented. For example, a target may be scanned twice. By another example, the scan speed and a data capture rate may be adjusted to provide for multiple measurements while an overlay target is within a field of view of the overlay metrology tool 102. By way of another example, a scanning overlay metrology tool 102 may generate interleaved data (e.g., interleaved images) using two or more measurement conditions. For example, the generation of interleaved images for scanning-based metrology is generally described in U.S. patent application Ser. No. 16/586,504 filed on Sep. 27, 2019, which is incorporated by reference in its entirety.

FIG. 5C is a schematic view of the adjustable pupil mask 106 configured as in FIG. 4B for simultaneous overlay metrology in accordance with one or more embodiments of the present disclosure. In FIG. 5C, the adjustable pupil mask 106 is located in a pupil plane 142 dedicated to the collection pathway 132. The diffracted orders illustrated in FIG. 5C are the same as for FIGS. 5A and 5B such that similar overlay measurements may be made using either the sequential illumination approach of FIGS. 5A and 5B or the simultaneous illumination approach of FIG. 5C. In FIG. 5C, all four illumination beams 116a-d may illuminate the sample simultaneously. The single control zone 402b is opaque to block or attenuate all 0-order diffraction 502a-d. Further, the central region 408 allows −1 order diffraction 504a-d and −2 order diffraction 506a-d from all illumination beams 116a-d to pass to the detector 128.

In some embodiments, an adjustable pupil mask 106 may be configured for double-order scattering (DOS) overlay metrology. In DOS overlay metrology, a periodic overlay target is illuminated with dipole illumination (e.g., two illumination beams 116 illuminating the sample at opposing azimuthal angles) and the measurement is based on two non-zero diffraction orders associated with each of the illumination beams 116. In one embodiment, DOS is performed with sequential illumination. For example, sequential DOS overlay metrology may be performed using the configurations of FIGS. 5A and 5B. In this configuration, non-zero diffraction 504a-d corresponds to −1 diffraction orders and non-zero diffraction 506a-d corresponds to −2 diffraction orders. By way of another example, simultaneous DOS overlay metrology may be performed using the configuration of FIG. 5C, where again the non-zero diffraction 504a-d corresponds to −1 diffraction orders and non-zero diffraction 506a-d corresponds to −2 diffraction orders.

In some embodiments, an adjustable pupil mask 106 may be configured for optical Moiré (OM) overlay metrology. In OM overlay metrology, an overlay target includes one or more cells with overlapping grating structures on two or more layers (e.g., as illustrated in FIG. 3) in which the grating structures have different periods. As a result, the collected light 130 may include one or more Moiré diffraction orders associated with a Moiré effect based on the difference in periodicity between the two gratings. For example, sequential OM overlay metrology may be performed using the configurations of FIGS. 5A and 5B. In this configuration, non-zero diffraction 504a-d corresponds to −1 diffraction orders and non-zero diffraction 506a-d corresponds to Moiré diffraction orders. By way of another example, simultaneous OM overlay metrology may be performed using the configuration of FIG. 5C, where again the non-zero diffraction 504a-d corresponds to −1 diffraction orders and non-zero diffraction 506a-d corresponds to Moiré diffraction orders.

Additionally, grey-mode OM metrology may be performed where the control zones 402a-c of the adjustable pupil mask 106 are configured to attenuate rather than fully block the 0-order diffraction 502a-d from illumination beams 116a-d.

In some embodiments, an adjustable pupil mask 106 may be configured for Littrow overlay metrology. In Littrow overlay metrology, a periodic overlay target is illuminated with dipole illumination, where the periodicity and illumination wavelength are adjusted such that a diffraction order (typically first-order diffraction) retro-reflects back along the same angle as the incident light. Littrow overlay metrology may be implemented with the adjustable pupil mask 106 configured to be fully transmissive such that all light may pass through the pupil plane 142 unobstructed.

Figure 6A:
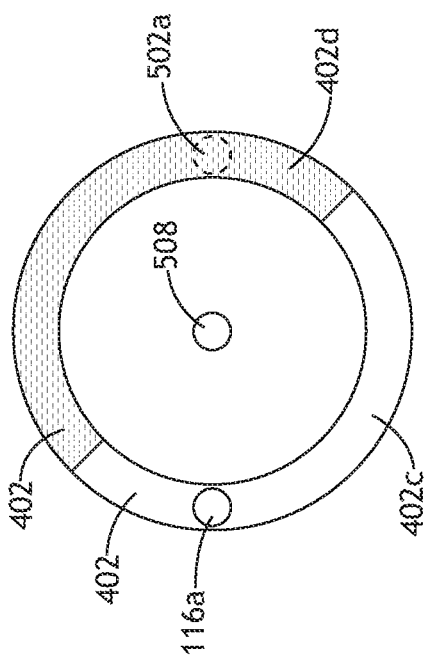
FIG. 6A is a schematic view of an adjustable pupil mask configured to be placed in a pupil plane common to the illumination pathway and the collection pathway to provide image-based scatterometry or grey-field scatterometry, in accordance with one or more embodiments of the present disclosure.

FIG. 6A is a schematic view of an adjustable pupil mask 106 configured to be placed in a pupil plane 142 common to the illumination pathway 118 and the collection pathway 132 to provide image-based scatterometry or grey-field scatterometry, in accordance with one or more embodiments of the present disclosure. The first control zone 402c is transparent to allow illumination beams 116a to illuminate the sample 104, and the second control zone 402d is opaque to either block or attenuate 0-order diffraction 502a. Further, a non-zero diffraction order 508 (typically first-order diffraction) may pass through the unobstructed central region 408.

Figure 6B:
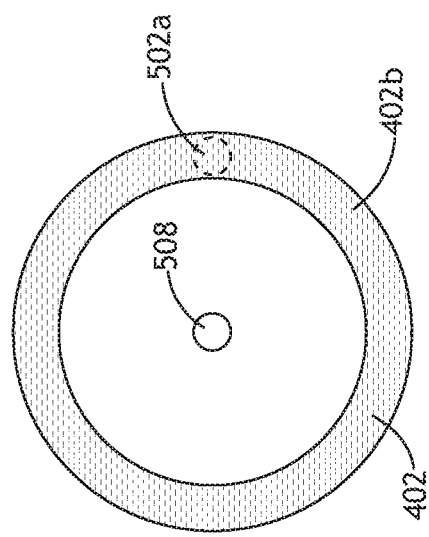
FIG. 6B is a schematic view of an adjustable pupil mask configured as in FIG. 4B to be placed in a pupil plane dedicated to the collection pathway to provide image-based scatterometry or grey-field scatterometry for overlay metrology, in accordance with one or more embodiments of the present disclosure.

FIG. 6B is a schematic view of an adjustable pupil mask 106 configured as in FIG. 4B to be placed in a pupil plane 142 dedicated to the collection pathway 132 to provide image-based scatterometry or grey-field scatterometry for overlay metrology, in accordance with one or more embodiments of the present disclosure. In FIG. 6B, the single control zone 402b may block or attenuate 0-order diffraction 502a and a non-zero diffraction order 508 (typically first-order diffraction) may pass through the unobstructed central region 408.

Figure 7:
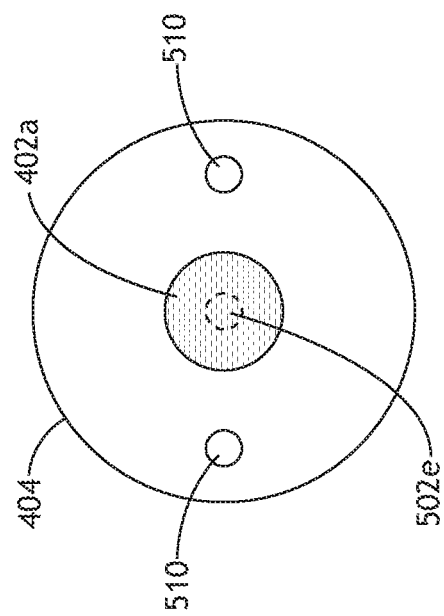
FIG. 7 is a schematic view of an adjustable pupil mask configured as in FIG. 4A to provide grey imaging overlay metrology, in accordance with one or more embodiments of the present disclosure.

FIG. 7 is a schematic view of an adjustable pupil mask 106 configured as in FIG. 4A to provide grey imaging overlay metrology, in accordance with one or more embodiments of the present disclosure. In FIG. 7, the adjustable pupil mask 106 is placed in a pupil plane 142 dedicated to the collection pathway 132. A periodic overlay target is illuminated with a single illumination beam 116 (not shown) at a normal angle of incidence. The adjustable pupil mask 106 has a single control zone 402a located in a central portion of the pupil boundary 404 to block or attenuate 0-order diffraction 502e, where non-zero diffraction 510 (e.g., +/−1 order diffraction) may pass through the pupil plane 142 unobstructed.

As illustrated by FIGS. 4A through 7, an adjustable pupil mask 106 placed in at least collection pupil plane 142 and having one or more individually-adjustable control zones 402 distributed throughout the pupil plane 142 may facilitate highly customizable data collection for overlay metrology. Accordingly, a single overlay metrology tool may be configured to provide overlay metrology measurements using a wide variety of techniques. In some embodiments, a single overlay metrology tool may be dynamically configured to switch between multiple overlay metrology techniques for different targets on a single sample or set of samples. In this regard, massive sampling may be achieved.

Figure 8:
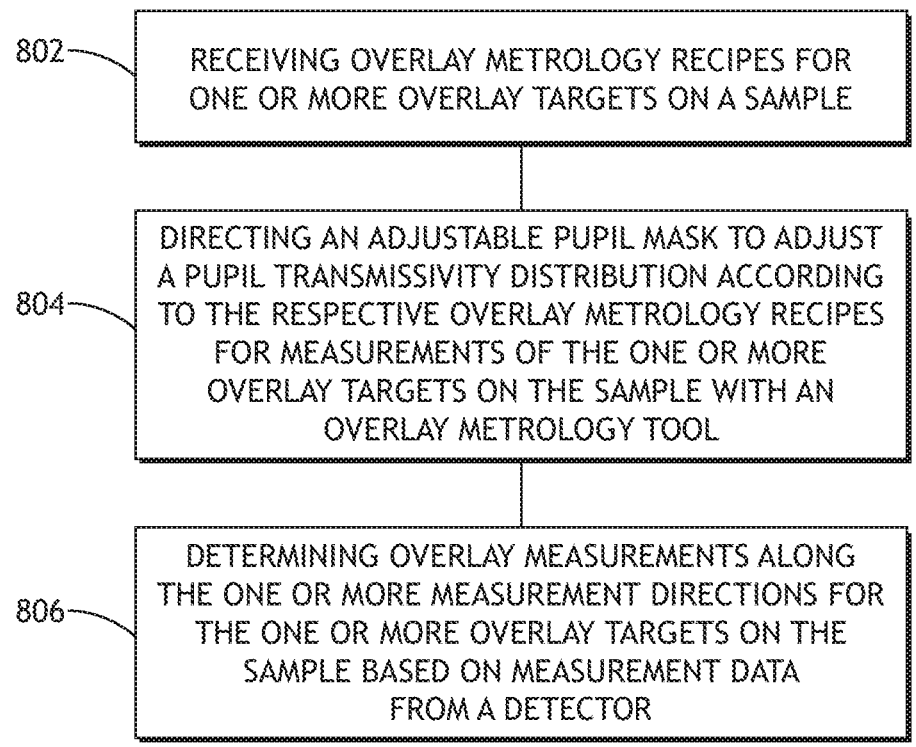
FIG. 8 is a flow diagram illustrating steps performed in an overlay metrology method, in accordance with one or more embodiments of the present disclosure.

FIG. 8 is a flow diagram illustrating steps performed in an overlay metrology method 800, in accordance with one or more embodiments of the present disclosure. Applicant notes that the embodiments and enabling technologies described previously herein in the context of the overlay metrology system 100 should be interpreted to extend to method 800. It is further noted, however, that the method 800 is not limited to the architecture of the overlay metrology system 100.

In one embodiment, the method includes a step 802 of receiving overlay metrology recipes for one or more overlay targets on a sample. For example, a recipe may include measurement parameters suitable for configuring a metrology tool such as, but not limited to, the overlay metrology system 100. Accordingly, a recipe may include parameters such as, but not limited to, the wavelength of one or more illumination beams 116, one or more illumination angles associated with one or more illumination beams 116, a polarization of one or more illumination beams 116, whether two or more illumination beams 116 are to illuminate an overlay target simultaneously or sequentially, or whether the overlay target is to be stationary or moving during a measurement. By way of another example, a recipe may include one or more processing steps (e.g., to be performed by the controller 108) for generating an overlay measurement along one or more measurement directions based on measurement data from the detector 128. Accordingly, a recipe may generally provide the parameters or steps required to generate an overlay measurement from an overlay target using a particular overlay metrology technique.

In another embodiment, the method 800 includes a step 804 of directing an adjustable pupil mask (e.g., the adjustable pupil mask 106) to adjust a pupil transmissivity distribution according to the respective overlay metrology recipes for measurements of the one or more overlay targets on the sample with an overlay metrology tool (e.g., the overlay metrology system 100. In another embodiment, the method 800 includes a step 806 of determining overlay measurements along the one or more measurement directions for the one or more overlay targets on the sample based on measurement data from a detector (e.g., detector 128). In this regard, the adjustable pupil mask 106 may enable the overlay metrology system 100 to generate overlay measurements on any number of overlay targets using any number of overlay techniques.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random-access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology tool comprising:
    an illumination source;
    one or more illumination optics configured to illuminate an overlay target on a sample with one or more illumination beams from the illumination source, wherein the overlay target includes periodic features along one or more measurement directions;
    one or more collection optics configured to direct diffracted light from the periodic features of the overlay target to a detector;
    an adjustable pupil mask located at a pupil plane, wherein the pupil plane corresponds to a collection pupil plane, wherein the adjustable pupil mask includes one or more control zones distributed across one or more portions of the pupil plane, wherein the one or more control zones are individually addressable to provide an adjustable pupil transmissivity distribution, wherein the adjustable pupil transmissivity distribution provides selective control of the passage of diffracted light in the respective one or more portions of the pupil plane to the detector, wherein the one or more control zones provide operability of the overlay metrology tool according to two or more measurement modes utilizing different pupil transmissivity distributions; and
    a controller communicatively coupled to the adjustable pupil mask, the controller including one or more processors configured to execute program instructions causing the one or more processors to:
        direct the adjustable pupil mask to provide a selected pupil transmissivity distribution corresponding to a selected overlay metrology recipe, wherein the selected pupil transmissivity distribution corresponds to a selected configuration of the one or more control zones providing transmission of a selected set of diffraction orders from the target to the detector associated with one of the two or more metrology modes and
        determine overlay measurements along the one or more measurement directions associated with the one of the one or more metrology modes based on measurement data from the detector.

2. The overlay metrology tool of claim 1, further comprising:
    an objective lens, wherein the one or more illumination optics illuminate the overlay target with the one or more illumination beams through the objective lens, wherein the one or more collection optics direct the diffracted light collected by the objective lens to the detector, wherein the pupil plane including the adjustable pupil mask further corresponds to an illumination pupil plane.

3. The overlay metrology tool of claim 2, wherein the one or more control zones are individually addressable to illuminate the overlay target with a selected number of the one of the one or more illumination beams, wherein at least some of the one or more control zones are placed in portions of the pupil plane corresponding to the one or more illumination beams to provide selective control of the one or more illumination beams on the sample.

4. The overlay metrology tool of claim 2, wherein the illumination source comprises a quadrupole illumination source providing symmetric illumination beams along two orthogonal directions in the pupil plane, wherein the one or more control zones includes two control zones arranged to form an annulus in the pupil plane, wherein each of the two control zones corresponds to half of the annulus, wherein each of the two control zones is oriented two pass light from two orthogonal illumination beams of the one or more illumination beams, pass one or more non-zero diffracted orders of light from the sample in response to the light from the two orthogonal illumination beams, and at least one of block or optically attenuate zero-order diffraction from the sample in response to the light from the two orthogonal illumination beams.

5. The overlay metrology tool of claim 4, wherein transmissivities of the two control zones may be sequentially alternated to provide sequential measurements of the overlay target with opposing illumination beams.

6. The overlay metrology tool of claim 2, wherein the one or more illumination optics include one or more fibers having output ends disposed at the pupil plane.

7. The overlay metrology tool of claim 2, wherein the pupil plane corresponds to an internal pupil plane of the objective lens.

8. The overlay metrology tool of claim 2, wherein the pupil plane corresponds to relayed plane conjugate to an internal pupil plane of the objective lens.

9. The overlay metrology tool of claim 1, wherein one of the one or more illumination beams is arranged illuminate the overlay target at normal incidence, wherein the one or more control zones includes a circular control zone centered in the pupil plane, wherein the circular control zone is oriented to pass one or more non-zero diffracted orders of light from the sample in response to the light from the illumination beam at normal incidence, and at least one of block or optically attenuate zero-order diffraction from the illumination beam at normal incidence.

10. The overlay metrology tool of claim 1, wherein the one or more control zones includes an annular control zone, wherein the annular control zone is oriented to pass one or more non-zero diffracted orders of light from the sample in response to the light from each of the one or more illumination beams, and at least one of block or optically attenuate zero-order diffraction from the sample in response to the light from each of the one or more illumination beams.

11. The overlay metrology tool of claim 1, further comprising:
an objective lens, wherein the one or more collection optics direct the diffracted light collected by the objective lens to the detector, wherein the one or more illumination optics direct the one or more illumination beams from the illumination source to the sample at oblique angles using one or more focusing lenses proximate to the objective lens.

12. The overlay metrology tool of claim 1, wherein at least one of the one or more control zones comprises:
a mechanical shutter.

13. The overlay metrology tool of claim 1, wherein at least one of the one or more control zones comprises:
an electro-optical attenuator.

14. The overlay metrology tool of claim 1, wherein at least one of the one or more control zones comprises:

a spatial light modulator providing an adjustable transmissivity.

15. The overlay metrology tool of claim 1, wherein the detector comprises:
a static imaging detector to image one or more locations on a static sample.

16. The overlay metrology tool of claim 1, wherein the detector comprises:
a scanning detector to image one or more locations on a moving sample.

17. An overlay metrology tool comprising:
an illumination source;
one or more illumination optics configured to illuminate an overlay target on a sample with one or more illumination beams from the illumination source, wherein the overlay target includes periodic features along one or more measurement directions;
one or more collection optics configured to direct diffracted light from the overlay target to a detector;
an adjustable pupil mask located at a pupil plane, wherein the pupil plane corresponds to a collection pupil plane, wherein the adjustable pupil mask includes one or more control zones distributed across one or more portions of the pupil plane, wherein the one or more control zones are individually addressable to provide an adjustable pupil transmissivity distribution, wherein the adjustable pupil transmissivity distribution provides selective control of the passage of diffracted light in the respective one or more portions of the pupil plane to the detector, wherein the one or more control zones provide operability of the overlay metrology tool according to two or more measurement modes utilizing different pupil transmissivity distributions; and
a controller communicatively coupled to the adjustable pupil mask, the controller including one or more processors configured to execute program instructions causing the one or more processors to:
receive overlay metrology recipes for a plurality of overlay targets on the sample associated with selected measurement modes of the two or more measurement modes;
direct the adjustable pupil mask to adjust the pupil transmissivity distribution according to the respective overlay metrology recipes associated with the selected measurement modes of the two or more measurement modes for measurements of the plurality of overlay targets on the sample; and
determine overlay measurements along the one or more measurement directions associated with the selected measurement modes of the two or more metrology modes for the plurality of overlay targets on the sample based on measurement data from the detector.

18. The overlay metrology tool of claim 17, wherein the plurality of overlay targets includes two or more target designs, wherein the two or more target designs comprise:
at least one imaging target design providing an overlay measurement based on an image requiring a first overlay metrology recipe; and
at least one scatterometry target design providing an overlay measurement based on a distribution of diffracted light requiring a second overlay metrology recipe.

19. The overlay metrology tool of claim 17, wherein the plurality of overlay targets includes at least one target requiring two or more measurements with different overlay metrology recipes.

20. The overlay metrology tool of claim 17, wherein the detector comprises:
a static imaging detector to image one or more locations on a static sample, wherein at least one of the overlay metrology recipes provides for a measurement when the sample is static.

21. The overlay metrology tool of claim 17, wherein the detector comprises:
a scanning detector to image one or more locations on a moving sample, wherein at least one of the overlay metrology recipes provides for a measurement when the sample is moving.

22. The overlay metrology tool of claim 17, further comprising:
an objective lens, wherein the one or more illumination optics illuminate the overlay target with the one or more illumination beams through the objective lens, wherein the one or more collection optics direct the diffracted light collected by the objective lens to the detector, wherein the pupil plane including the adjustable pupil mask further corresponds to an illumination pupil plane.

23. The overlay metrology tool of claim 22, wherein the one or more control zones are individually addressable to illuminate the overlay target with a selected number of the one of the one or more illumination beams, wherein at least some of the one or more control zones are placed in portions of the pupil plane corresponding to the one or more illumination beams to provide selective control of the one or more illumination beams on the sample.

24. The overlay metrology tool of claim 22, wherein the illumination source comprises a quadrupole illumination source providing symmetric illumination beams along two orthogonal directions in the pupil plane, wherein the one or more control zones includes two control zones arranged to form an annulus in the pupil plane, wherein each of the two control zones corresponds to half of the annulus, wherein each of the two control zones is oriented two pass light from two orthogonal illumination beams of the one or more illumination beams, pass one or more non-zero diffracted orders of light from the sample in response to the light from the two orthogonal illumination beams, and at least one of block or optically attenuate zero-order diffraction from the sample in response to the light from the two orthogonal illumination beams.

25. The overlay metrology tool of claim 24, wherein transmissivities of the two control zones may be sequentially alternated to provide sequential measurements of the overlay target with opposing illumination beams.

26. The overlay metrology tool of claim 22, wherein the one or more illumination optics include one or more fibers having output ends disposed at the pupil plane.

27. The overlay metrology tool of claim 22, wherein the pupil plane corresponds to an internal pupil plane of the objective lens.

28. The overlay metrology tool of claim 22, wherein the pupil plane corresponds to relayed plane conjugate to an internal pupil plane of the objective lens.

29. The overlay metrology tool of claim 17, wherein one of the one or more illumination beams is arranged illuminate the overlay target at normal incidence, wherein the one or more control zones includes a circular control zone centered in the pupil plane, wherein the circular control zone is oriented to pass one or more non-zero diffracted orders of light from the sample in response to the light from the illumination beam at normal incidence, and at least one of block or optically attenuate zero-order diffraction from the illumination beam at normal incidence.

30. The overlay metrology tool of claim 17, wherein the one or more control zones includes an annular control zone, wherein the annular control zone is oriented to pass one or more non-zero diffracted orders of light from the sample in response to the light from each of the one or more illumination beams, and at least one of block or optically attenuate zero-order diffraction from the sample in response to the light from each of the one or more illumination beams.

31. The overlay metrology tool of claim 17, an objective lens, wherein the one or more collection optics direct the diffracted light collected by the objective lens to the detector, wherein the one or more illumination optics direct the one or more illumination beams from the illumination source to the sample at oblique angles using one or more focusing lenses proximate to the objective lens.

32. The overlay metrology tool of claim 17, wherein at least one of the one or more control zones comprises:
a mechanical shutter.

33. The overlay metrology tool of claim 17, wherein at least one of the one or more control zones comprises:
an electro-optical attenuator.

34. The overlay metrology tool of claim 17, wherein at least one of the one or more control zones comprises:
a spatial light modulator providing an adjustable transmissivity.

35. A method comprising:
receiving overlay metrology recipes for one or more overlay targets on a sample;
directing an adjustable pupil mask to adjust a pupil transmissivity distribution according to the respective overlay metrology recipes for measurements of the one or more overlay targets on the sample with an overlay metrology tool, wherein the overlay metrology tool comprises:
one or more illumination optics configured to illuminate an overlay target with one or more illumination beams from an illumination source, wherein the overlay target includes periodic features along one or more measurement directions;
one or more collection optics configured to direct diffracted light from the overlay target to a detector; and
the adjustable pupil mask located at a pupil plane, wherein the pupil plane corresponds to a collection pupil plane, wherein the adjustable pupil mask includes one or more control zones distributed across one or more portions of the pupil plane, wherein the one or more control zones are individually addressable to provide an adjustable pupil transmissivity distribution, wherein the adjustable pupil transmissivity distribution provides selective control of the passage of diffracted light in the respective one or more portions of the pupil plane to the detector, wherein the one or more control zones provide operability of the overlay metrology tool according to two or more measurement modes utilizing different pupil transmissivity distributions; and
determining overlay measurements along the one or more measurement directions associated with the one of the one or more metrology modes for the one or more overlay targets on the sample based on measurement data from the detector.

* * * * *